US012731764B2

(12) United States Patent
Sato et al.

(10) Patent No.: US 12,731,764 B2

(45) Date of Patent: Sep. 8, 2026

(54) SUBSTRATE PROCESSING METHOD AND PLASMA PROCESSING APPARATUS

(71) Applicant: Tokyo Electron Limited, Tokyo (JP)

(72) Inventors: Takuma Sato, Hillsboro, OR (US); Shota Yoshimura, Miyagi (JP); Motoki Noro, Miyagi (JP); Hsinkai Wang, Miyagi (JP); Kota Oikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 342 days.

(21) Appl. No.: 18/240,395

(22) Filed: Aug. 31, 2023

(65) Prior Publication Data

US 2024/0071727 A1 Feb. 29, 2024

(30) Foreign Application Priority Data

Aug. 31, 2022 (JP) ................................. 2022-137727
Apr. 4, 2023 (JP) ................................. 2023-060737

(51) Int. Cl.

*H10P 50/00* (2026.01)
*H01J 37/32* (2006.01)

(52) U.S. Cl.

CPC .. *H01J 37/32449* (2013.01); *H01J 37/32458* (2013.01); *H01J 37/32715* (2013.01); *H01J 37/32899* (2013.01); *H01J 2237/327* (2013.01); *H01J 2237/334* (2013.01); *H01J 2237/336* (2013.01)

(58) Field of Classification Search

None

See application file for complete search history.

(56) References Cited

U.S. PATENT DOCUMENTS

2020/0227275 A1* 7/2020 Mullick ................ H10P 50/266
2023/0402366 A1* 12/2023 Liang .................... H10W 20/40

FOREIGN PATENT DOCUMENTS

JP H09-050984 A 2/1997
JP 2022-101060 A 7/2022
JP 2022-124668 A 8/2022
WO 2021/153171 A1 8/2021

* cited by examiner

*Primary Examiner* — Roberts P Culbert

(74) *Attorney, Agent, or Firm* — XSENSUS LLP

(57) ABSTRACT

A substrate processing method includes: (a) providing a substrate including a first region containing a first material including silicon and a second region containing a second material different from the first material; (b) etching the second region while forming a metal-containing layer on the first region, by a plasma generated from a processing gas including halogen and metal; (c) removing the metal-containing layer with a base.

17 Claims, 9 Drawing Sheets

1
2
2a
2a1
2a2
2a3
10
10a
10e
10s
11
13
13a
13b
13c
20
21
22
30
31
31a
31b
32
32a
32b
40
111
111a
111b
112
1110
1110a
1111
1111a
1111b
W

SUBSTRATE PROCESSING METHOD AND PLASMA PROCESSING APPARATUS

CROSS-REFERENCE TO RELATED APPLICATIONS

This application is based on and claims priority from Japanese Patent Application Nos. 2022-137727, and 2023-060737, filed on Aug. 31, 2022, and Apr. 4, 2023, respectively, with the Japan Patent Office, the disclosures of each of which are incorporated herein in their entireties by reference.

TECHNICAL FIELD

The present disclosure relates to a substrate processing method and a plasma processing apparatus.

BACKGROUND

Japanese Patent Laid-Open Publication No. 09-050984 discloses a method of etching an insulating film using plasma. In the method, the etching is performed while forming a conductive layer on the surface of the insulating film during the etching. For the etching, plasma generated from a mixed gas of $WF_6$ and $C_4F_8$ is used.

SUMMARY

According to an embodiment, a substrate processing method includes: (a) providing a substrate including a first region containing a first material including silicon and a second region containing a second material different from the first material; (b) etching the second region while forming a metal-containing layer on the first region, by a plasma generated from a processing gas including halogen and metal; (c) removing the metal-containing layer with a base.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
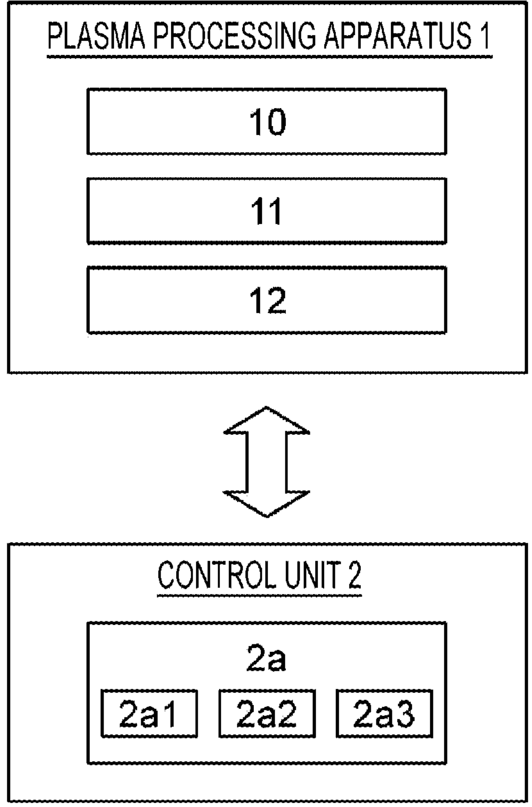
FIG. 1 is a view schematically illustrating a plasma processing system according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described in detail with reference to the drawings. In the respective drawings, similar or corresponding portions will be denoted by the same reference numerals.

FIG. 1 is a view illustrating an example of a configuration of a plasma processing system. In an embodiment, the plasma processing system includes a plasma processing apparatus 1 and a control unit 2. The plasma processing system is an example of a substrate processing system, and the plasma processing apparatus 1 is an example of a substrate processing apparatus. The plasma processing apparatus 1 includes a plasma processing chamber 10, a substrate support unit 11, and a plasma generation unit 12. The plasma processing chamber 10 has a plasma processing space. Further, the plasma processing chamber 10 includes at least one gas supply port for supplying at least one processing gas into the plasma processing space, and at least one gas discharge port for discharging a gas from the plasma processing space. The gas supply port is connected to a gas supply unit 20 to be described later, and the gas discharge port is connected to an exhaust system 40 to be described later. The substrate support unit 11 is disposed in the plasma processing space, and has a substrate support surface for supporting a substrate thereon.

The plasma generation unit 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance (ECR) plasma, helicon wave plasma (HWP), or surface wave plasma (SWP). Various types of plasma generation units including an alternating current (AC) plasma generation unit and a direct current (DC) plasma generation unit may be used. In an embodiment, an AC signal (AC power) used in the AC plasma generation unit has a frequency in the range of 100 kHz to 10 GHz. Accordingly, the AC signal includes a radio frequency (RF) signal and a microwave signal. In an embodiment, the RF signal has a frequency in the range of 100 kHz to 150 MHz.

The control unit 2 processes computer-executable commands to cause the plasma processing apparatus 1 to perform various processes described herein. The control unit 2 may be configured to control each component of the plasma processing apparatus 1 to perform the various processes described herein below. In an embodiment, a portion of the control unit 2 or the entire control unit 2 may be included in the plasma processing apparatus 1. The control unit 2 may include a processing unit **2*a*1, a storage unit 2*a*2, and a communication interface 2*a*3. The control unit 2 is implemented by, for example, a computer 2*a*. The processing unit 2*a*1 may be configured to perform various control operations by reading programs from the storage unit 2*a*2 and executing the read programs. The programs may be stored in the storage unit 2*a*2 in advance, or may be acquired via a medium when necessary. The acquired programs are stored in the storage unit 2a2, and read from the storage unit 2a2 to be executed by the processing unit 2a1. The medium may be any of various storage media readable by the computer 2a, or may be a communication line connected to the communication interface 2a3. The processing unit 2a1 may be a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1** via a communication line such as a local area network (LAN).

Figure 2:
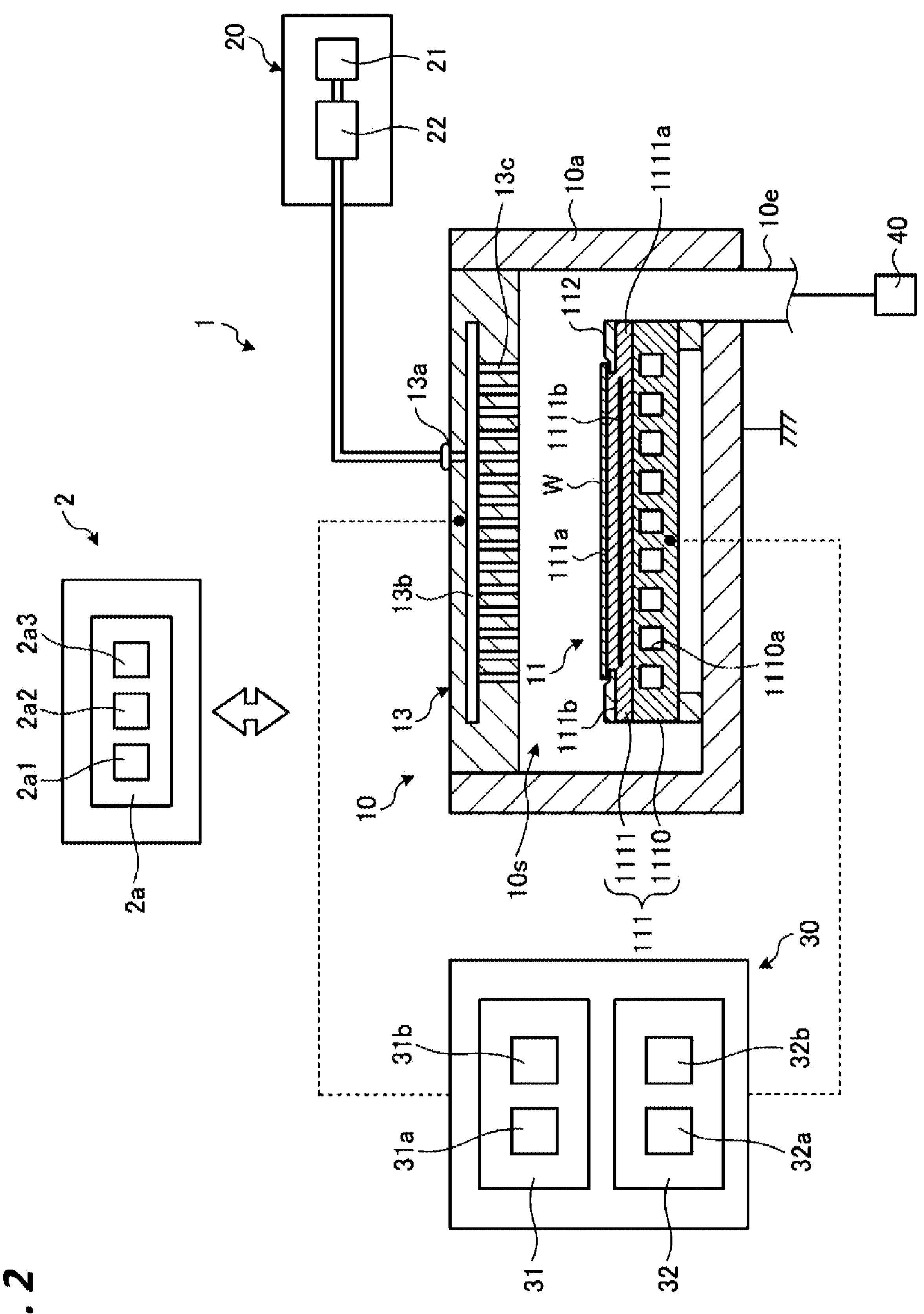
FIG. 2 is a view schematically illustrating a plasma processing apparatus according to an embodiment.

Hereinafter, an example of a configuration of a capacitively coupled plasma processing apparatus, which is an example of the plasma processing apparatus 1, will be described. FIG. 2 is a view illustrating an example of a configuration of the capacitively coupled plasma processing apparatus.

A capacitively coupled plasma processing apparatus 1 includes a plasma processing chamber 10, a gas supply unit 20, a power supply 30, and an exhaust system 40. Further, the plasma processing apparatus 1 includes a substrate support unit 11 and a gas introduction unit. The gas introduction unit is configured to introduce at least one processing gas into the plasma processing chamber 10. The gas introduction unit includes a shower head 13. The substrate support unit 11 is disposed inside the plasma processing chamber 10. The shower head 13 is disposed above the substrate support unit 11. In an embodiment, the shower head 13 makes up at least a portion of the ceiling of the plasma processing chamber 10. The plasma processing chamber 10 has a plasma processing space 10s defined by the shower head 13, the side wall 10a of the plasma processing chamber 10, and the substrate support unit 11. The plasma processing chamber 10 is grounded. The shower head 13 and the substrate support unit 11 are electrically insulated from the housing of the plasma processing chamber 10.

The substrate support unit 11 includes a main body 111 and a ring assembly 112. The main body 111 has a central region 111a for supporting a substrate W, and an annular region 111b for supporting the ring assembly 112. A wafer is an example of the substrate W. The annular region 111b of the main body 111 surrounds the central region 111a of the main body 111 in plan view. The substrate W is disposed on the central region 111a of the main body 111, and the ring assembly 112 is disposed on the annular region 111b of the main body 111 to surround the substrate W disposed on the central region 111a of the main body 111. Accordingly, the central region 111a is also referred to as the substrate support surface for supporting the substrate W, and the annular region 111b is also referred to as a ring support surface for supporting the ring assembly 112.

In an embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111a and an electrostatic electrode 1111b disposed inside the ceramic member 1111a. The ceramic member 1111a has the central region 111a. In an embodiment, the ceramic member 1111a also has the annular region 111b. Another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 1111 and the annular insulating member. Further, at least one RF/DC electrode coupled to an RF power supply 31 and/or a DC power supply 32 to be described later may be disposed inside the ceramic member 1111a. In this case, at least one RF/DC electrode functions as a lower electrode. When a bias RF signal and/or a DC signal to be described later is supplied to at least one RF/DC electrode, the RF/DC electrode is also referred to as a bias electrode. Further, the conductive member of the base 1110 and at least one RF/DC electrode may function as a plurality of lower electrodes. The electrostatic electrode 1111b may function as a lower electrode. Thus, the substrate support unit 11 includes at least one lower electrode.

The ring assembly 112 includes one or a plurality of annular members. In an embodiment, the one or plurality of annular members include one or a plurality of edge rings and at least one cover ring. The edge ring is formed of a conductive material or an insulating material, and the cover ring is formed of an insulating material.

The substrate support unit 11 may include a temperature adjustment module configured to adjust at least one of the electrostatic chuck 1111, the ring assembly 112, and the substrate to a target temperature. The temperature adjustment module may include a heater, a heat transfer medium, a flow path 1110a, or a combination thereof. A heat transfer fluid such as brine or a gas flows through the flow path 1110a. In an embodiment, the flow path 1110a is formed inside the base 1110, and one or a plurality of heaters is disposed inside the ceramic member 1111a of the electrostatic chuck 1111. The substrate support unit 11 may include a heat transfer gas supply unit configured to supply a heat transfer gas to the gap between the back surface of the substrate W and the central region 111a.

The shower head 13 is configured to introduce at least one processing gas from the gas supply unit 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b, and is introduced into the plasma processing space 10s from the plurality of gas introduction ports 13c. The shower head 13 includes at least one upper electrode. The gas introduction unit may include one or a plurality of side gas injectors (SGI) attached to one or a plurality of openings formed in the side wall 10a, in addition to the shower head 13.

The gas supply unit 20 may include at least one gas source 21 and at least one flow rate controller 22. In an embodiment, the gas supply unit 20 is configured to supply at least one processing gas from the corresponding gas source 21 to the shower head 13 via the corresponding flow rate controller 22. Each flow rate controller 22 may include, for example, a mass flow controller or a pressure-controlled flow rate controller. The gas supply unit 20 may further include at least one flow rate modulation device that modulates or pulses the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. As a result, plasma is formed from at least one processing gas supplied into the plasma processing space 10s. Accordingly, the RF power supply 31 may function as at least a portion of the plasma generation unit 12. By supplying the bias RF signal to at least one lower electrode, a bias potential is generated in the substrate W, so that ion components in the formed plasma may be attracted into the substrate W.

In an embodiment, the RF power supply 31 includes a first RF generation unit 31*a* and a second RF generation unit 31*b*. The first RF generation unit 31*a* is coupled to at least one lower electrode and/or at least one upper electrode via at least one impedance matching circuit, and is configured to generate a source RF signal (source RF power) for generating plasma. In an embodiment, the source RF signal has a frequency in the range of 10 MHz to 150 MHz. In an embodiment, the first RF generation unit 31*a* may be configured to generate a plurality of source RF signals with different frequencies. One or a plurality of generated source RF signals are supplied to at least one lower electrode and/or at least one upper electrode.

The second RF generation unit 31*b* is coupled to at least one lower electrode via at least one impedance matching circuit, and is configured to generate a bias RF signal (bias RF power). The frequency of the bias RF signal may be the same as or different from the frequency of the source RF signal. In an embodiment, the bias RF signal has a frequency lower than the frequency of the source RF signal. In an embodiment, the bias RF signal has a frequency in the range of 100 kHz to 60 MHz. In an embodiment, the second RF generation unit 31*b* may be configured to generate a plurality of bias RF signals with different frequencies. One or a plurality of generated bias RF signals are supplied to at least one lower electrode. In various embodiments, at least one of the source RF signal and the bias RF signal may be pulsed.

The power supply 30 may further include a DC power supply 32 coupled to the plasma processing chamber 10. The DC power supply 32 includes a first DC generation unit 32*a* and a second DC generation unit 32*b*. In an embodiment, the first DC generation unit 32*a* is connected to at least one lower electrode, and is configured to generate a first DC signal. The generated first DC signal is applied to at least one lower electrode. In an embodiment, the second DC generation unit 32*b* is connected to at least one upper electrode, and is configured to generate a second DC signal. The generated second DC signal is applied to at least one upper electrode.

In various embodiments, the first and second DC signals may be pulsed. In this case, a sequence of voltage pulse is applied to at least one lower electrode and/or at least one upper electrode. The voltage pulse may have a square, trapezoidal, or triangular pulse waveform, or a combination thereof. In an embodiment, a waveform generation unit for generating the sequence of voltage pulses from a DC signal is connected between the first DC generation unit 32*a* and at least one lower electrode. Thus, the first DC generation unit 32*a* and the waveform generation unit make up a voltage pulse generation unit. When the second DC generation unit 32*b* and the waveform generation unit make up the voltage pulse generation unit, the voltage pulse generation unit is connected to at least one upper electrode. The voltage pulse may have a positive polarity or a negative polarity. The sequence of voltage pulses may include one or a plurality of positive voltage pulses and one or a plurality of negative voltage pulses in one cycle. The first and second DC generation units 32*a* and 32*b* may be provided in addition to the RF power supply 31, and the first DC generation unit 32*a* may be provided in place of the second RF generation unit 31*b*.

The exhaust system 40 may be connected to a gas discharge port 10*e* formed at, for example, the bottom of the plasma processing chamber 10. The exhaust system 40 may include a pressure regulation valve and a vacuum pump. The pressure in the plasma processing space 10*s* is regulated by the pressure regulation valve. The vacuum pump may include a turbo molecular pump, a dry pump, or a combination thereof.

Figure 3:
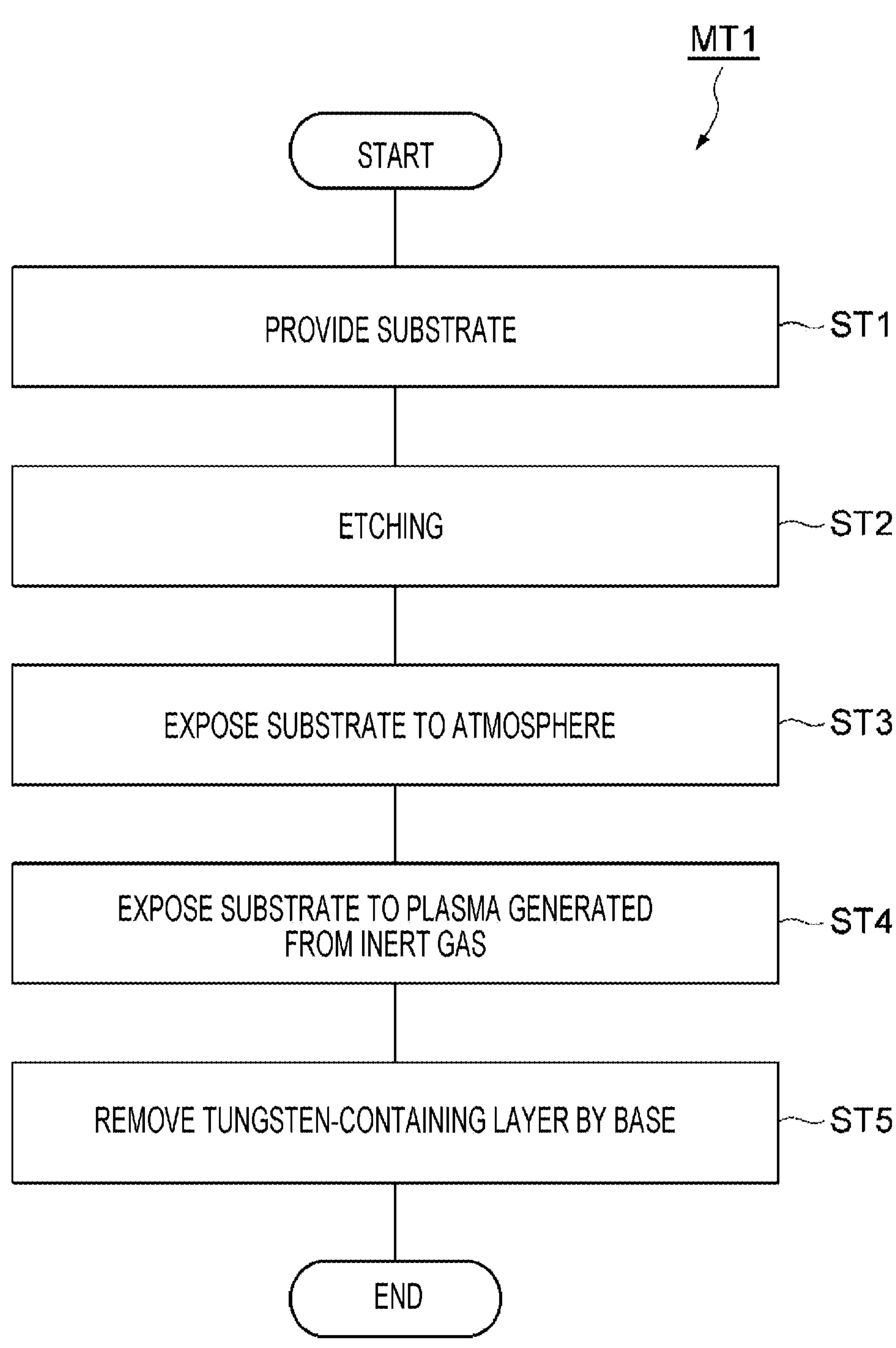
FIG. 3 is a flowchart of a substrate processing method according to an embodiment.

FIG. 3 is a flowchart of a substrate processing method according to an embodiment. A substrate processing method MT1 illustrated in FIG. 3 (hereinafter, referred to as a "method MT1") may be performed by the plasma processing apparatus 1 of the embodiment described above. The method MT1 may be applied to the substrate W.

Figure 4:
FIG. 4 is a cross-sectional view of an example of a substrate, to which the method of FIG. 3 is applicable.
Figure 4:
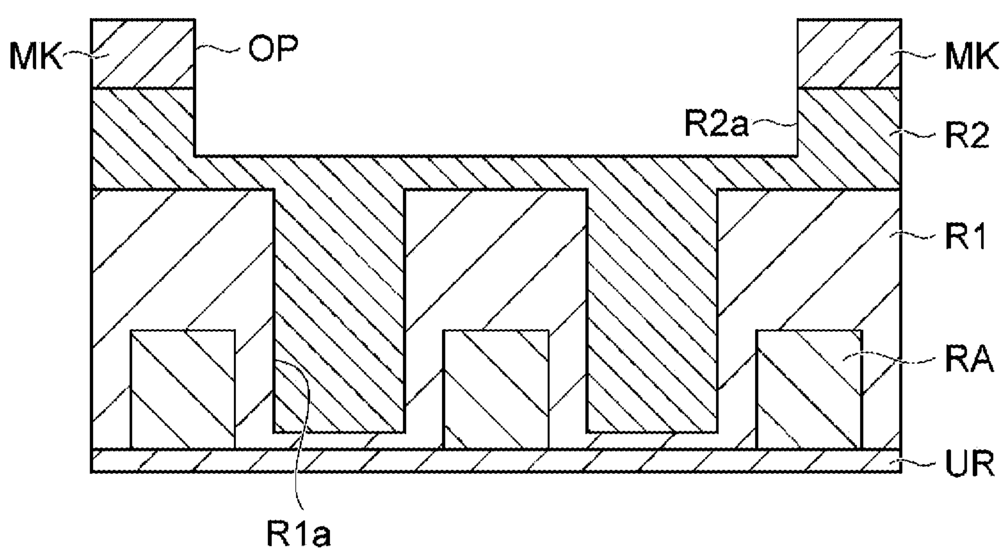

FIG. 4 is a cross-sectional view of an example of a substrate, to which the method of FIG. 3 is applicable. As illustrated in FIG. 4, in an embodiment, the substrate W includes a first region R1 and a second region R2. The first region R1 may have at least one recess R1*a*. The first region R1 may have a plurality of recesses R1*a*. Each recess R1*a* may be a recess for forming a contact hole. The second region R2 may be embedded in the recess R1*a*. The second region R2 may be provided to cover the first region R1.

The first region R1 contains a first material including silicon. The first region R1 may be a silicon-containing region. The first region R1 may further contain nitrogen. The first region R1 may contain silicon nitride ($SiN_x$). The first region R1 may be obtained through a film formation by, for example, a chemical vapor deposition (CVD), or may be obtained by nitriding silicon. The first region R1 may include a first portion containing silicon nitride ($SiN_x$) and a second portion containing silicon carbide (SiC). In this case, the first portion has the recess R1*a*.

The second region R2 contains a second material different from the first material of the first region R1. The second region R2 may contain silicon and oxygen. The second region R2 may contain silicon oxide ($SiO_x$). The second region R2 may be obtained through a film formation by, for example, the CVD, or may be obtained by oxidizing silicon. The second region R2 may have a recess R2*a*. The recess R2*a* has a larger width than that of the recess R1*a*.

The substrate W may include an underlying region UR and at least one raised region RA formed on the underlying region UR. The first region R1 covers the underlying region UR and the at least one raised region RA. The underlying region UR may contain silicon. A plurality of raised regions RA is positioned on the underlying region UR. The recess R1*a* of the first region R1 is positioned between adjacent raised regions RA. Each raised region RA may form a gate region of a transistor.

The substrate W may include a mask MK. The mask MK is formed on the second region R2. The mask MK may contain metal or silicon. The mask MK may have an opening OP. The opening OP corresponds to the recess R2*a* of the second region R2.

Figure 5:
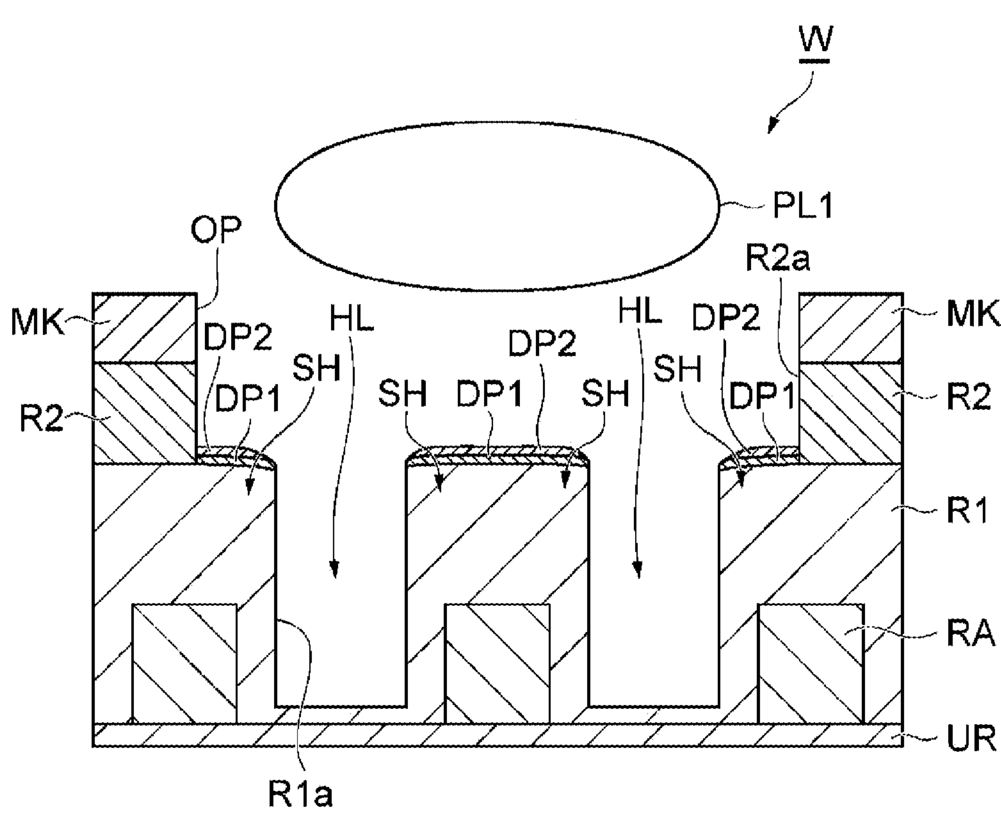
FIG. 5 is a cross-sectional view illustrating a step of a substrate processing method according to an embodiment.
Figure 6:
FIG. 6 is a cross-sectional view illustrating a step of a substrate processing method according to an embodiment.
Figure 6:
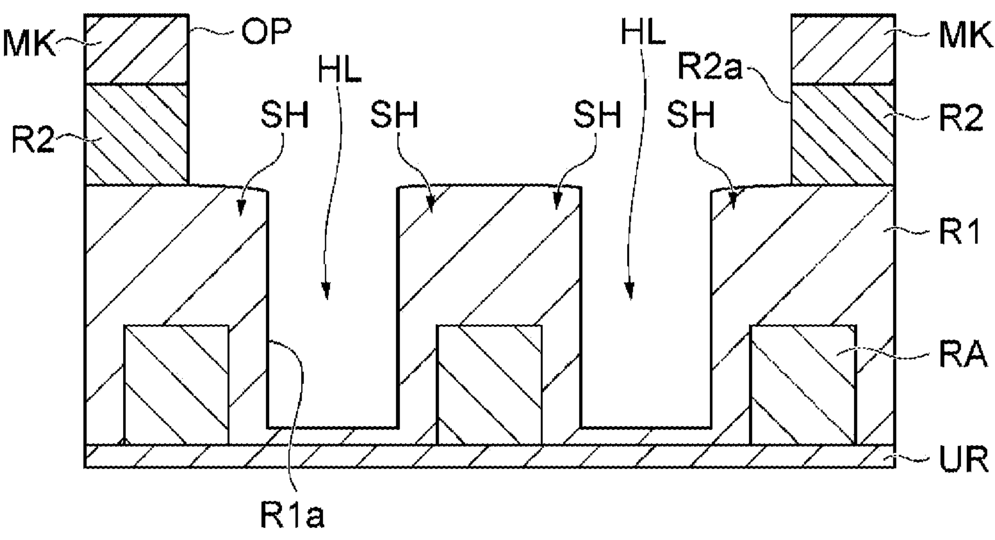

Hereinafter, the method MT1 will be described with reference to, for example, FIGS. 3 to 6, assuming that the method MT1 is applied to the substrate W using the plasma processing apparatus 1 of the embodiment described above. FIGS. 4 to 6 are each a cross-sectional view illustrating a step of the substrate processing method according to the embodiment. When the plasma processing apparatus 1 is used, the method MT1 may be performed in the plasma processing apparatus 1 through the control of each component of the plasma processing apparatus 1 by the control unit 2. In the method MT1, as illustrated in FIG. 2, the substrate W on the substrate support unit 11 disposed in the plasma processing chamber 10 is processed.

As illustrated in FIG. 3, the method MT1 may include steps ST1 to ST5. Steps ST1 to ST5 may be performed in sequence. Step ST4 may be performed in the same chamber as the chamber where step ST2 is performed. The method MT1 may not include at least one of steps ST2, ST3, and ST4. Step ST2 may be included in step ST1.

(Step ST1)

In step ST1, the substrate W illustrated in FIG. 4 is provided. The substrate W may be supported by the substrate support unit 11 inside the plasma processing chamber 10. The substrate W may have the shape illustrated in FIG. 4 as a result of a plasma etching, or may have the shape illustrated in FIG. 4 at the beginning when the substrate W is provided into the plasma processing chamber 10. In step ST1, the second region R2 may be provided to cover the first region R1. In step ST1, the top surface of the first region R1 and the top surface of the second region R2 may be exposed. That is, in step ST1, the top surface of silicon nitride and the top surface of silicon oxide may be exposed.

(Step ST2)

In step ST2, as illustrated in FIG. 5, the second region R2 may be etched while forming a metal-containing layer DP1 on the first region R1, by plasma PL1 generated from a processing gas. As a result of the etching, a contact hole HL may be formed corresponding to the recess R1*a*. That is, step ST2 may be performed in a self-aligned contact (SAC) etching process. The metal-containing layer DP1 may include at least one of molybdenum, tungsten, titanium, niobium, rhenium, osmium, ruthenium, platinum, germanium, and tantalum. The metal-containing layer DP1 may include at least one of halogen, carbon, and nitrogen. The halogen may include at least one of fluorine, chlorine, bromine, and iodine. A carbon-containing layer DP2 may be formed on the metal-containing layer DP1 by the plasma PL1. The carbon-containing layer DP2 may include at least one of halogen and nitrogen. The halogen may include at least one of fluorine, chlorine, bromine, and iodine. The metal-containing layer DP1 and the carbon-containing layer DP2 may be formed on a shoulder SH in the recess R1*a* of the first region R1 or on the bottom of the recess R1*a*. In step ST2, the second region R2 may be etched to expose the first region R1. In step ST2, the first region R1 may also be etched. In particular, the shoulder SH in the recess R1*a* of the first region R1 may be etched.

The processing gas in step ST2 may include halogen and a metal. The halogen may include at least one of fluorine, chlorine, bromine, and iodine. The metal may include at least one of molybdenum, tungsten, titanium, niobium, rhenium, osmium, ruthenium, platinum, germanium, and tantalum. The processing gas in step ST2 may further include carbon. The processing gas in step ST2 may include metal halide gas. The metal halide gas may include fluorine. The metal halide gas may include at least one gas selected from the group consisting of $WF_6$ gas, $MoF_6$ gas, $WC_{16}$ gas, $TiCl_4$ gas, $NbF_5$ gas, $ReF_6$ gas, $ReF_7$ gas, $OsF_6$ gas, $RuF_5$, $RuF_6$, $PtF_6$ gas, $GeF_4$, and $TaF_5$. The processing gas in step $ST_2$ may include a tungsten-containing gas that contains fluorine. Examples of the tungsten-containing gas that contains fluorine include tungsten hexafluoride ($WF_6$) gas. The tungsten-containing gas included in the processing gas of step ST2 may include tungsten halide gas. The tungsten halide gas may include at least one of tungsten hexafluoride ($WF_6$) gas, tungsten hexabromide ($WBr_6$) gas, tungsten hexachloride ($WCl_6$) gas, and $WF_5Cl$ gas. The tungsten-containing gas included in the processing gas of step ST2 may include hexacarbonyl tungsten ($W(CO)_6$) gas. The processing gas in step ST2 may further include a fluorine-containing gas that contains carbon. The processing gas in step ST2 may include at least one of fluorocarbon gas and hydrofluorocarbon gas. Examples of the fluorocarbon ($C_xF_y$) gas include $CF_4$ gas, $C_3F_6$ gas, $C_3F_8$ gas, $C_4F_8$ gas, and $C_4F_6$ gas, and examples of the hydrofluorocarbon ($C_xH_yF_z$) gas include $CH_2F_2$ gas, $CHF_3$ gas, and $CH_3F$ gas. The processing gas in step ST2 may further include an oxygen-containing gas. Examples of the oxygen-containing gas include oxygen gas. The processing gas in step ST2 may further include a noble gas.

In an embodiment, the processing gas may include a metal immediately before the first region R1 is exposed. In the etching, the mask MK is used. The etching may be performed as follows. First, the gas supply unit 20 supplies the processing gas into the plasma processing chamber 10. Then, the plasma generation unit 12 generates the plasma PL1 from the processing gas in the plasma processing chamber 10. The control unit 2 controls the gas supply unit 20 and the plasma generation unit 12 to etch the second region R2 such that the first region R1 is exposed. In step ST2, the bias power may or may not be applied to the electrode in the main body 111 of the substrate support unit 11. In particular, the bias power may not be applied from immediately before the exposure of the first region R1 to immediately after the exposure of the first region R1. As a result, deposits are easily formed, and the etching of the shoulder SH in the recess R1*a* is suppressed.

(Step ST3)

In step ST3, the substrate W may be exposed to the atmosphere. The substrate W may be taken out from the plasma processing chamber 10. The atmosphere includes nitrogen gas and oxygen gas. The atmosphere may further include water or water vapor ($H_2O$). The carbon-containing layer DP2 may be modified by the gases in the atmosphere.

(Step ST4)

In step ST4, the substrate W may be exposed to plasma generated from an inert gas. The inert gas may include a nitrogen-containing gas. Examples of the nitrogen-containing gas include nitrogen gas. Step ST4 may be performed in the plasma processing chamber 10. The carbon-containing layer DP2 may be modified by the plasma generated from the inert gas.

(Step ST5)

In step ST5, as illustrated in FIG. 6, the metal-containing layer DP1 is removed by a base. The metal-containing layer DP1 may be partially or entirely removed. The carbon-containing layer DP2 may be removed. The carbon-containing layer DP2 may be partially or entirely removed. Step ST5 may be performed in a different chamber from the plasma processing chamber 10 where step ST2 or ST4 is performed.

The pH of the base is higher than 7. The pH of the base may be 11 or less. The base may be a gas or a liquid. The base may include at least one of ammonia, sodium carbonate, and sodium bicarbonate. The base may include an ammonium aqueous solution. The ammonia concentration of the ammonium aqueous solution may be 500 ppm or less, or 200 ppm or less.

After step ST5, the first region R1 located at the bottom of the recess R1*a* may be etched by plasma. The etching may be performed such that the underlying region UR is exposed.

According to the method MT1 described above, the metal-containing layer DP1 may be removed by the reaction between the metal-containing layer and the base.

When the method MT1 includes at least one of steps ST3 and ST4, the carbon-containing layer DP2 may be removed in step ST5.

Hereinafter, various experiments conducted to evaluate the method MT1 will be described. The experiments described below do not limit the present disclosure.

Experiment 1

In Experiment 1, the substrate W illustrated in FIG. 4 was prepared. The substrate W includes the first region R1 containing silicon nitride ($SiN_x$) and the second region R2 containing silicon oxide ($SiO_x$). Then, steps ST2 to ST5 were performed on the substrate W using the plasma processing apparatus 1.

In step ST2, the plasma PL1 was generated, in the plasma processing chamber 10, from a processing gas including tungsten hexafluoride ($WF_6$) gas, oxygen gas, $C_4F_6$ gas, and argon gas, and the substrate W was exposed to the plasma PL1.

In step ST3, the substrate W was taken out from the plasma processing chamber 10. As a result, the substrate W was exposed to the atmosphere. Then, the substrate W was disposed in the plasma processing chamber 10.

In step ST4, plasma was generated from a processing gas including nitrogen gas in the plasma processing chamber 10, and the substrate W was exposed to the plasma.

In step ST5, the substrate W was taken out from the plasma processing chamber 10, and was exposed to the ammonium aqueous solution.

Experiment 2

Experiment 2 was conducted in the same manner as Experiment 1, except that step ST5 was not performed.

Experiment 3

Experiment 3 was conducted in the same manner as Experiment 1, except that step ST3 was not performed.

Experiment 4

Experiment 4 was conducted in the same manner as Experiment 1, except that steps ST3 and ST5 were not performed.

Experiment 5

Experiment 5 was conducted in the same manner as Experiment 1, except that steps ST3 and ST4 were not performed.

First Experimental Result

First, in Experiment 1, a TEM image of the cross section of the substrate W was observed after performing step ST2 and before performing step ST3. As a result, as illustrated in FIG. 5, it was confirmed that the metal-containing layer DP1 and the carbon-containing layer DP2 were formed on the first region R1 of the substrate W.

Next, a TEM image of the cross section of the substrate W obtained in each of Experiments 1 to 5 was observed. As a result, in Experiment 1, neither the metal-containing layer DP1 nor the carbon-containing layer DP2 was found. In Experiment 2, both the metal-containing layer DP1 and the carbon-containing layer DP2 were found. In Experiment 3, the metal-containing layer DP1 was not found, and the carbon-containing layer DP2 was found. In Experiment 4, both the metal-containing layer DP1 and the carbon-containing layer DP2 were found. In Experiment 5, the metal-containing layer DP1 was not found, and the carbon-containing layer DP2 was found. Therefore, it can be seen that the metal-containing layer DP1 is entirely removed in Experiments 1, 3, and 5. Further, it can be seen that the carbon-containing layer DP2 is entirely removed in Experiment 1 in which steps ST3 and ST5 are performed.

Figure 7:
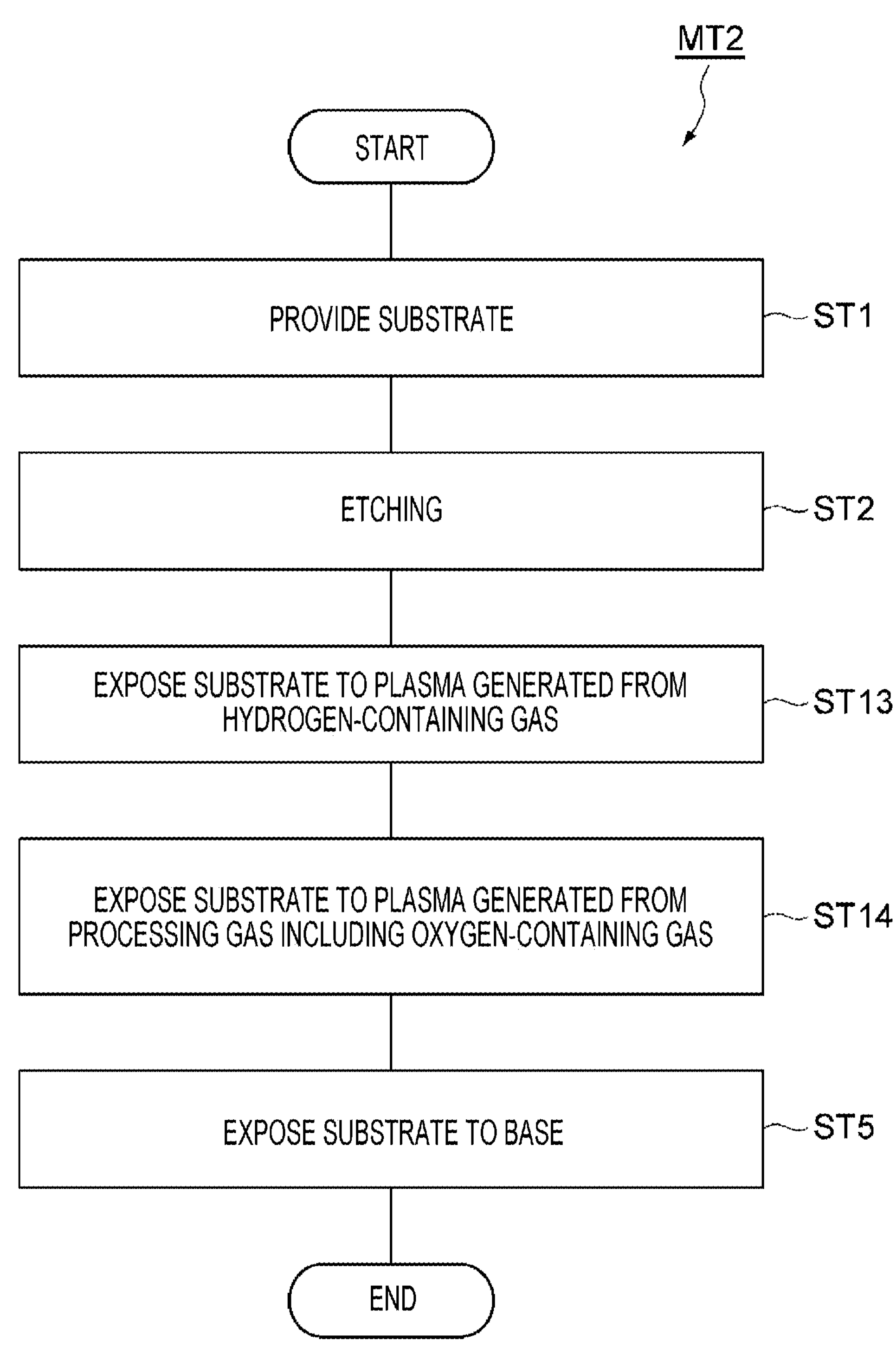
FIG. 7 is a flowchart of a substrate processing method according to an embodiment.

FIG. 7 is a flowchart of a substrate processing method according to an embodiment. A substrate processing method MT2 illustrated in FIG. 7 (hereinafter, referred to as a "method MT2") may be performed by the plasma processing apparatus 1 of the embodiment described above. The method MT2 may be applied to the substrate W of FIG. 4.

Hereinafter, the method MT2 will be described with reference to, for example, FIGS. 4 to 7, assuming that the method MT2 is applied to the substrate W using the plasma processing apparatus 1 of the embodiment described above. When the plasma processing apparatus 1 is used, the method MT2 may be performed in the plasma processing apparatus 1 through the control of each component of the plasma processing apparatus 1 by the control unit 2. In the method MT2, as illustrated in FIG. 2, the substrate W on the substrate support unit 11 disposed in the plasma processing chamber 10 is processed.

As illustrated in FIG. 7, the method MT2 may include steps ST1, ST2, ST13, ST14, and ST5. Steps ST1, ST2, ST13, ST14, and ST5 may be performed in sequence. Steps ST2, ST13, and ST14 may be performed in-situ or in multiple different chambers, respectively. The method MT2 may not include at least one of steps ST2, ST13, and ST5. Steps ST1, ST2, and ST5 may be performed in the same manner as performed the method MT1. Step ST2 may be included in step ST1. In the method MT2 as well, the first region R1 located at the bottom of the recess R1*a* may be etched by plasma after step ST14 or ST5. The etching may be performed such that the underlying region UR is exposed.

(Step ST13)

In step ST13, the substrate W may be exposed to plasma generated from a hydrogen-containing gas. Examples of the hydrogen-containing gas include hydrogen gas. Step ST13 may be performed in the plasma processing chamber 10.

(Step ST14)

In step ST14, the substrate W may be exposed to plasma generated from a processing gas including an oxygen-containing gas. The metal-containing layer DP1 may be removed by the plasma. The carbon-containing layer DP2 may be removed. The oxygen-containing gas may be at least one of oxygen ($O_2$) gas, carbon monoxide (CO) gas, carbon dioxide ($CO_2$) gas, and carbonyl sulfide (COS) gas. The processing gas in step ST14 may further include an inert gas. Examples of the inert gas include a nitrogen gas. In the processing gas of step ST14, the flow rate of the oxygen-containing gas may be smaller than the flow rate of the inert gas. As a result, the oxidation of the substrate W is suppressed. Step ST14 may be performed in the plasma processing chamber 10.

In step ST14, the temperature of the substrate support unit 11 may be 100° C. or higher, 120° C. or higher, 130° C. or higher, above 130° C., 140° C. or higher, or 150° C. or higher. Further, the temperature of the substrate support unit 11 may be 250° C. or lower, or 200° C. or lower.

In step ST14, the pressure in the plasma processing chamber 10 may be 1 mTorr (0.13 Pa) or more, or 10 mTorr (1.3 Pa) or more. Further, the pressure in the plasma processing chamber 10 may be 50 mTorr (6.7 Pa) or less, or 30 mTorr (4.0 Pa) or less.

Figure 8:
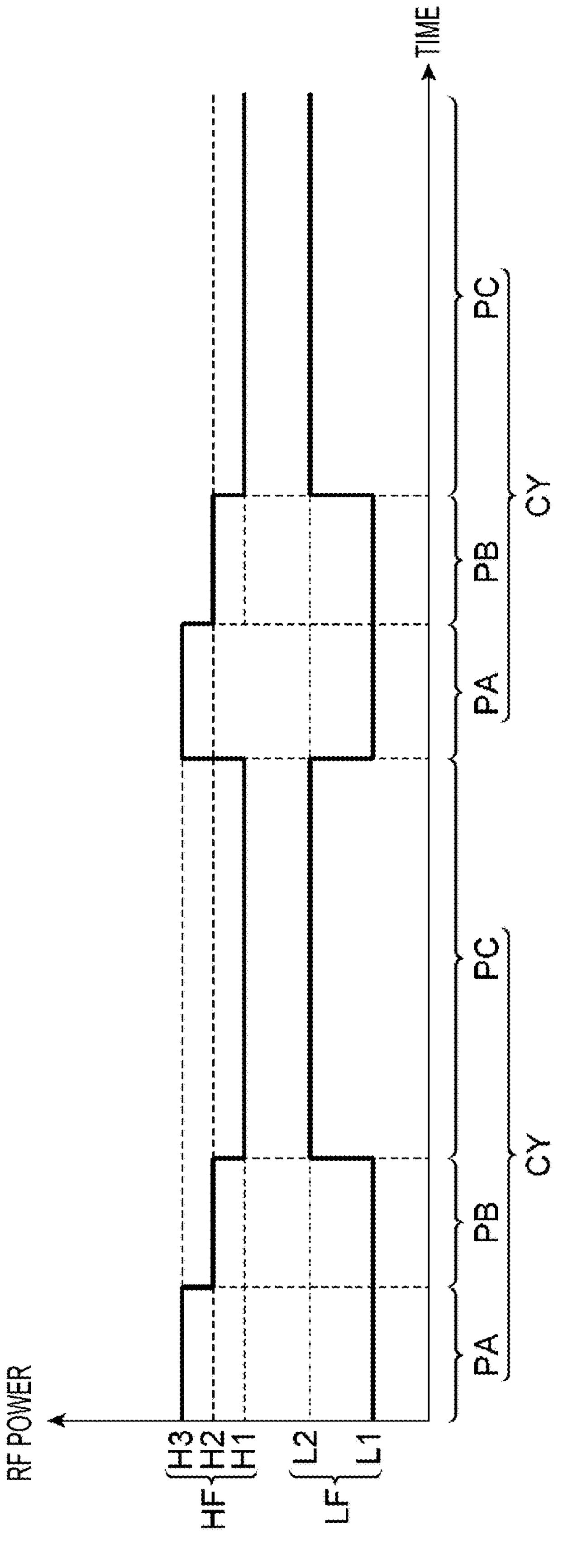
FIG. 8 is an example of a timing chart illustrating time variations of a bias RF power applied to an electrode of a main body and a source RF power applied to a counter electrode.

FIG. 8 is an example of a timing chart illustrating time variations of the bias RF power applied to the electrode of the main body 111 of the substrate support unit 11 and the source RF power applied to the counter electrode. The timing chart is related to step ST14 of the method MT2. In step ST14, a bias RF power LF may be supplied to the substrate support unit 11. The bias RF power LF may be supplied to the conductive member of the substrate support unit 11. In step ST14, a source RF power HF may be supplied to the plasma processing apparatus 1, in order to generate plasma. The source RF power HF may be supplied to an antenna including one or a plurality of coils.

The descriptions below relate to an example of a power used for the substrate W having a diameter of 300 millimeters. The bias RF power LF may be 10 W or more and 300 W or less, 30 W or more and 200 W or less, or 50 W or more and 100 W or less. The frequency of the bias RF power LF may be 100 kHz or more and 40.68 Mhz or less.

The source RF power HF may be 50 W or more and 1,000 W or less, 80 W or more and 800 W or less, or 100 W or more and 500 W or less. The frequency of the source RF power HF may be 27 MHz or more and 100 MHz or less.

The bias RF power LF and the source RF power HF may be applied periodically in a cycle CY. The cycle CY may include a first period PA, a second period PB, and a third period PC. That is, step ST14 may include the first period PA, the second period PB, and the third period PC. The second period PB is subsequent to the first period PA. The third period PC is subsequent to the second period PB. In step ST14, one cycle corresponding to the cycle CY including the first period PA, the second period PB, and the third period PC may be repeated two or more times.

In the first period PA, the power level of the source RF power HF is maintained at a first level H3 (e.g., more than 100 W), and the power level of the bias RF power LF is maintained at a second level L1 (e.g., less than 100 W). The second level L1 is lower than the first level H3. In the first period PA, the formation of radicals in the plasma is accelerated, so that the chemical reaction between oxygen-containing radicals and the metal-containing layer DP1/the carbon-containing layer DP2 is progressed.

In the second period PB, the power level of the source RF power HF is maintained at a third level H2 (e.g., less than 200 W), and the power level of the bias RF power LF is maintained at the second level L1. The third level H2 is lower than the first level H3 and higher than the second level L1. In the second period PB, the ion flux is reduced, so that the shoulder SH in the recess R1*a* of the first region R1 is less damaged by ions.

In the third period PC, the power level of the source RF power HF is maintained at a fourth level H1 (e.g., less than 100 W), and the power level of the bias RF power LF is maintained at a fifth level L2 (e.g., more than 50 W). The fourth level H1 is lower than the third level H2. The fifth level L2 is higher than the second level L1, lower than the first level H3, lower than the third level H2, and lower than the fourth level H1. In the third period PC, the ions in the plasma collide with the substrate W, accelerating the removal of the metal-containing layer DP1 and the carbon-containing layer DP2. By maintaining the fifth level L2 low, the shoulder SH in the recess R1*a* of the first region R1 may be less damaged by ions.

The proportion of the first period PA in the cycle CY is smaller than the proportion of the third period PC in the cycle CY. The proportion of the first period PA in the cycle CY may be 10% or more, or less than 50%. The proportion of the third period PC in the cycle CY may be 50% or more. The frequency that defines the cycle CY may be 0.1 kHz or more and 1 MHz or less. The time length of the cycle CY is the reciprocal of the frequency that defines the cycle CY.

Instead of the bias RF power LF, a DC bias may be supplied to the substrate support unit 11 as an electrical bias. The DC bias may include a voltage pulse. When the electrical bias is the bias RF power, the level of the electrical bias is the power level of the bias RF power. When the electrical bias includes a voltage pulse, the level of the electrical bias is the absolute value of the negative voltage level of the voltage pulse.

According to the method MT2 described above, the metal-containing layer DP1 may be removed by the reaction between the metal-containing layer DP1 and chemical species including oxygen. Further, the carbon-containing layer DP2 may also be removed by the reaction between the carbon-containing layer DP2 and the chemical species including oxygen. For example, when a tungsten-containing layer is removed using carbon monoxide gas, volatile hexacarbonyl tungsten ($W(CO)_6$) may be generated. In step ST14, when carbon monoxide gas or carbon dioxide gas is used as the oxygen-containing gas, the removal of the metal-containing layer DP1 and the carbon-containing layer DP2 may be accelerated, as compared to a case where oxygen gas is used. Further, in step ST14, when carbon monoxide gas is used as the oxygen-containing gas, the etching of the first region R1 may be suppressed, as compared to a case where carbon dioxide gas is used. Therefore, the reduction of the shoulder SH in the recess R1*a* of the first region R1 and the expansion of the dimension of the recess R1*a* may be suppressed.

Hereinafter, various experiments conducted to evaluate the method MT2 will be described. The experiments described below do not limit the present disclosure.

Experiment 6

In Experiment 6, the substrate W illustrated in FIG. 4 was prepared. The substrate W includes the first region R1 containing silicon nitride ($SiN_x$) and the second region R2 containing silicon oxide ($SiO_x$). Then, step ST2 and ST14 were performed on the substrate W using the plasma processing apparatus 1.

In step ST2, the plasma PL1 was generated, in the plasma processing chamber 10, from a processing gas including tungsten hexafluoride ($WF_6$) gas, oxygen gas, $C_4F_6$ gas, and argon gas, and the substrate W was exposed to the plasma PL1.

In step ST14, plasma was generated from a processing gas including oxygen gas in the plasma processing chamber 10, and the substrate W was exposed to the plasma.

Experiment 7

Experiment 7 was conducted in the same manner as Experiment 6, except that in step ST14, plasma was generated from a processing gas including oxygen gas and nitrogen gas. The flow rate of oxygen gas was smaller than that of nitrogen gas.

Second Experimental Result

A TEM image of the cross section of the substrate W obtained in each of Experiments 6 and 7 was observed. As a result, in Experiments 6 and 7, neither the metal-containing layer DP1 nor the carbon-containing layer DP2 was found. Further, Experiment 7 is an experiment in which the oxygen gas in step ST14 of Experiment 6 is replaced with the nitrogen gas. Therefore, it can be seen that the metal-containing layer DP1 and the carbon-containing layer DP2 are entirely removed in Experiments 6 and 7 in which step ST14 is performed.

Experiment 8

Experiment 8 was conducted in the same manner as Experiment 1, except that step ST13 was performed between steps ST2 and ST4 without performing step ST3.

In step ST13, plasma was generated from a processing gas including hydrogen gas in the plasma processing chamber 10, and the substrate W was exposed to the plasma.

Experiment 9

Experiment 9 was conducted in the same manner as Experiment 8, except that step ST5 was not performed.

Third Experimental Result

A TEM image of the cross section of the substrate W obtained in each of Experiments 8 and 9 was observed. As a result, in Experiment 8, the metal-containing layer DP1 was somewhat found, but the carbon-containing layer DP2 was not found. In Experiment 9, the metal-containing layer DP1 was found, but the carbon-containing layer DP2 was not found. Therefore, it can be seen that the metal-containing layer DP1 is partially removed in Experiment 8 in which step ST5 is performed. Further, it can be seen that the carbon-containing layer DP2 is entirely removed in Experiments 8 and 9 in which steps ST13 and ST4 are performed.

Experiment 10

In Experiment 10, the substrate W illustrated in FIG. 4 was prepared. The substrate W includes the first region R1 containing silicon nitride ($SiN_x$) and the second region R2 containing silicon oxide ($SiO_x$). Then, step ST2 and ST14 were performed on the substrate W using the plasma processing apparatus 1.

In step ST2, the plasma PL1 was generated, in the plasma processing chamber 10, from a processing gas including tungsten hexafluoride ($WF_6$) gas, a hydrogen-containing gas, fluorocarbon gas, and argon gas, and the substrate W was exposed to the plasma PL1. With the plasma PL1, the second region R2 was etched while forming the metal-containing layer DP1 on the first region R1 (see, e.g., FIG. 5).

In step ST14, plasma was generated from a processing gas including nitrogen gas and oxygen gas in the plasma processing chamber 10, and the substrate W was exposed to the plasma. The metal-containing layer DP1 was removed by the plasma (see, e.g., FIG. 6). In step ST14, the flow rate of oxygen gas was smaller than that of nitrogen gas. The pressure in the plasma processing chamber 10 was 10 mTorr (1.3 Pa). The temperature of the substrate support unit 11 was 150° C.

In step ST14, as illustrated in FIG. 8, the bias RF power LF and the source RF power HF were applied periodically in the cycle CY. In the first period PA, the power level of the source RF power HF was maintained at 700 W, and the power level of the bias RF power LF was maintained at 0 W. In the second period PB, the power level of the source RF power HF was maintained at 100 W, and the power level of the bias RF power LF was maintained at 0 W. In the third period PC, the power level of the source RF power HF was maintained at 0 W, and the power level of the bias RF power LF was maintained at 50 W. The frequency defining the cycle CY was 0.4 kHz. The proportion of the first period PA in the cycle CY was 24%. The proportion of the third period PC in the cycle CY was 60%.

After step ST14, plasma was generated, in the plasma processing chamber 10, from a processing gas including a hydrogen-containing gas, hydrofluorocarbon gas, and argon gas, and the substrate W was exposed to the plasma. The first region R1 located at the bottom of the recess R1*a* was etched by the plasma, to expose the underlying region UR.

Experiment 11

Experiment 11 was conducted in the same manner as Experiment 10, except that in step ST14, carbon dioxide gas was used, instead of oxygen gas. Accordingly, the processing gas includes nitrogen gas and carbon dioxide gas. The flow rate of carbon dioxide gas was smaller than that of nitrogen gas.

Experiment 12

Experiment 12 was conducted in the same manner as Experiment 10, except that in step ST14, carbon monoxide gas was used, instead of oxygen gas. Accordingly, the processing gas includes nitrogen gas and carbon monoxide gas. The flow rate of carbon monoxide gas was smaller than that of nitrogen gas.

Experiment 13

Experiment 13 was conducted in the same manner as Experiment 10, except that in step ST14, oxygen gas was not used. Accordingly, the processing gas is nitrogen gas.

Fourth Experimental Result

In Experiments 11 to 13, a TEM image of the cross section of the substrate W was observed after step ST14 and before the etching of the bottom of the recess R1*a*. Through an energy dispersive X-ray spectroscopy (EDS), the metal-containing layer DP1 was found in Experiment 13, but was not found in Experiments 11 and 12. From the experimental result, it can be seen that the metal-containing layer DP1 may be removed by the plasma generated from the processing gas including an oxygen-containing gas.

Further, the amount of reduction of the shoulder SH in the recess R1*a* of the first region R1 was measured. The reduction amount is the distance between the lower end of the shoulder SH and the top surface of the first region R1 in the direction perpendicular to the main surface of the substrate W. In Experiment 13, the amount of reduction of the shoulder SH was 3.5 nm. In Experiment 11, the amount of reduction of the shoulder SH was 4.1 nm. In Experiment 12, the amount of reduction of the shoulder SH was 3.9 nm. Further, the dimension (critical dimension (CD)) of the recess R1*a* at the lower end of the shoulder SH was measured. In Experiment 13, the CD was 14.8 nm. In Experiment 11, the CD was 16.8 nm. In Experiment 12, the CD was 14.8 nm. From the experimental result, it can be seen that when carbon monoxide gas is used, the amount of reduction of the shoulder SH and the amount of expansion of the CD may be reduced, as compared to a case where carbon dioxide gas is used.

Fifth Experimental Result

In Experiments 11 to 13, a TEM image of the cross section of the substrate W and an SEM image of the upper surface of the substrate W were observed after the etching of the bottom of the recess R1*a*. While residues were found on the bottom of the recess R1*a* in Experiment 13, no residues were found on the bottom of the recess R1*a* in Experiments 11 and 12. In Experiment 10, resides were somewhat found on the bottom of the recess R1*a*. The residues are caused from the metal-containing layer DP1 remaining on the bottom of the recess R1*a* after step ST14. From the experimental result, it can be seen that the metal-containing layer DP1 on the bottom of the recess R1*a* may be removed by the plasma generated from the processing gas including an oxygen-containing gas.

Figure 9:
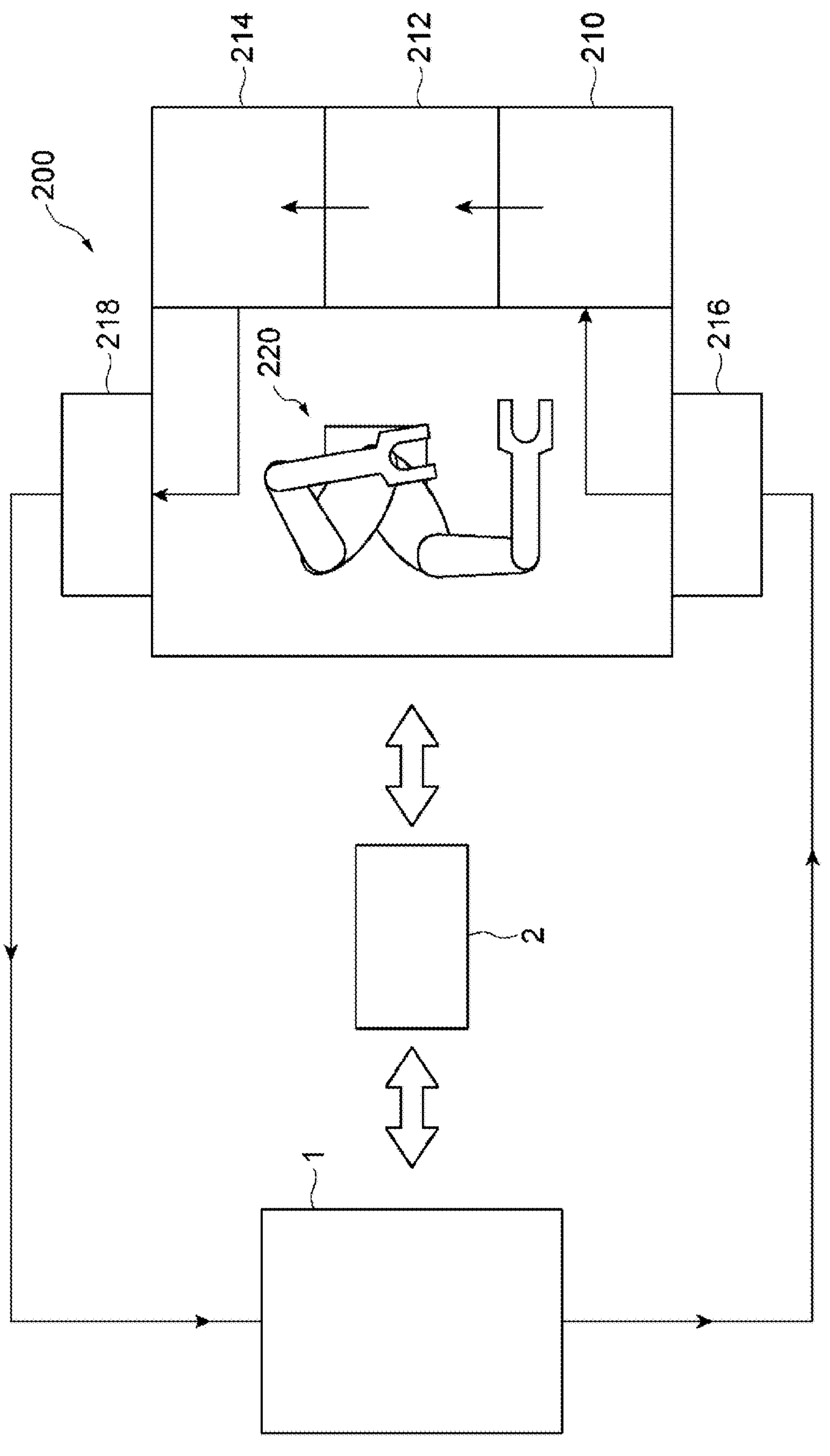
FIG. 9 is a view schematically illustrating a substrate processing apparatus according to an embodiment.

FIG. 9 is a view schematically illustrating a substrate processing apparatus according to an embodiment. The method MT1 or MT1 may be applied to the substrate W using the substrate processing apparatus illustrated in FIG. 9.

The substrate processing apparatus of FIG. 9 includes the plasma processing apparatus 1, the control unit 2, and a wet processing apparatus 200. The substrate processing apparatus may include a transfer robot that transfers the substrate W between the plasma processing apparatus 1 and the wet processing apparatus 200. The control unit 2 is configured to control each component of the plasma processing apparatus 1 and the wet processing apparatus 200. The method MT1 or MT2 may be performed in the substrate processing apparatus of FIG. 9 under the control by the control unit 2.

The wet processing apparatus 200 may include a container 210 for accommodating a base such as an alkali aqueous solution, a container 212 for accommodating a rinse liquid, and a container 214 for accommodating pure water. The wet processing apparatus 200 may include a dryer for drying the substrate W.

The wet processing apparatus 200 may include a carry-in port 216 for receiving the substrate W carried out from the plasma processing apparatus 1, a carry-out port 218 for carrying out the substrate W to the plasma processing apparatus 1, and a transfer robot 220 that transfers the substrate W. The transfer robot 220 transfers the substrate W from the carry-in port 216 to the container 210. The transfer robot 220 transfers the substrate W from the container 210 to the container 212. The transfer robot 220 transfers the substrate W from the container 212 to the container 214. The transfer robot 220 transfers the substrate W from the container 214 to the carry-out port 218.

When the method MT1 is performed in the substrate processing apparatus of FIG. 9, steps ST1, ST2, and ST4 may be performed in the plasma processing chamber 10 of the plasma processing apparatus 1. Step ST5 may be performed in the container 210 (chamber) of the wet processing apparatus 200. In step ST5, a base is supplied to the substrate W. As a result, the metal-containing layer DP1 is removed by the base. The substrate W may be immersed in the base inside the container 210. Then, the substrate W may be immersed in a rinse liquid inside the container 212. Then, the substrate W may be immersed in the pure water inside the container 214. Then, the substrate W may be dried in the dryer of the wet processing apparatus 200. Alternatively, the substrate W may be dried by reducing the pressure in the plasma processing chamber 10 of the plasma processing apparatus 1.

While the various embodiments have been described, various additions, omissions, substitutions, and modifications may be made without being limited to the embodiments described above. Further, elements in different embodiments may be combined with each other, so as to implement another embodiment.

For example, each step of the method MT1 and each step of the method MT2 may be arbitrarily combined. Step ST13 of the method MT2 may be performed, instead of step ST3, between steps ST2 and ST4 of the method MT1.

Here, the various embodiments included in the present disclosure are described in [E1] through [E19] below.

[E1] A substrate processing method including:

(a) providing a substrate including a first region containing a first material including silicon and a second region containing a second material different from the first material;

(b) etching the second region while forming a metal-containing layer on the first region, by a plasma generated from a processing gas including halogen and metal;

(c) removing the metal-containing layer with a base.

According to the method [E1], the metal-containing layer may be removed by a reaction between the metal-containing layer and the base.

[E2] The substrate processing method according to [E1], further including:

(d) between (b) and (c), exposing the substrate to an atmosphere.

In this case, even when a carbon-containing layer is formed on the metal-containing layer, the carbon-containing layer may be removed in (c).

[E3] The substrate processing method according to [E1] or [E2], further including:

(e) between (b) and (c), exposing the substrate to a plasma generated from an inert gas.

In this case, even when a carbon-containing layer is formed on the metal-containing layer, the carbon-containing layer may be removed in (c).

[E4] The substrate processing method according to any one of [E1] to [E3], wherein (c) is performed in a different chamber from the chamber in which (b) is performed.

[E5] The substrate processing method according to any one of [E1] to [E4], wherein the processing gas further includes carbon.

[E6] The substrate processing method according to any one of [E1] to [E5], wherein pH of the base is equal to or less than 11.

[E7] The substrate processing method according to any one of [E1] to [E6], wherein the metal is at least one of molybdenum, tungsten, titanium, niobium, rhenium, osmium, ruthenium, platinum, germanium, and tantalum.

[E8] The substrate processing method according to any one of [E1] to [E7], wherein the processing gas includes metal halide gas.

[E9] A substrate processing method including:

(a) providing a substrate including a silicon-containing region with a recess and a metal-containing layer formed on the silicon-containing region, the metal-containing layer including halogen; and (b) removing the metal-containing layer by a plasma generated from a processing gas including an oxygen-containing gas.

According to the method [E9], the metal-containing layer may be removed by a reaction between the metal-containing layer including halogen and chemical species including oxygen.

[E10] The substrate processing method according to [E9], wherein in (a), a region inside the recess is etched by a plasma generated from a processing gas including halogen and metal.

[E11] The substrate processing method according to [E9] or [E10], wherein the substrate further includes a carbon-containing layer formed on the metal-containing layer.

[E12] The substrate processing method according to any one of [E9] to [E11], wherein the processing gas in (b) further includes an inert gas.

[E13] The substrate processing method according to any one of [E9] to [E12], further including:

(c) between (a) and (b), exposing the substrate to a plasma generated from a hydrogen-containing gas; and (d) after (b), exposing the substrate to a base.

[E14] The substrate processing method according to any one of [E9] to [E13], wherein the metal-containing layer includes at least one of molybdenum, tungsten, titanium, niobium, rhenium, osmium, ruthenium, platinum, germanium, and tantalum.

[E15] The substrate processing method according to any one of [E11] to [E14], wherein the processing gas includes metal halide gas.

[E16] The substrate processing method according to any one of [E9] to [E15], wherein the oxygen-containing gas is at least one of oxygen gas, carbon monoxide gas, carbon dioxide gas, and carbonyl sulfide gas.

[E17] The substrate processing method according to any one of [E9] to [E16], wherein (b) includes (b1) setting a power level of a radio-frequency power for generating the plasma to a first level, and a level of an electrical bias supplied to a substrate support that supports the substrate to a second level, (b2) after (b1), setting the power level of the radio-frequency power to a third level lower than the first level, and the level of the electrical bias to the second level, and (b3) after (b2), setting the power level of the radio-frequency power to a fourth level lower than the third level, and the level of the electrical bias to a fifth level higher than the second level.

[E18] A plasma processing apparatus including:

a chamber;

a substrate support configured to support a substrate in the chamber, the substrate including a silicon-containing region with a recess and a metal-containing layer formed on the silicon-containing region, and the metal-containing layer including halogen;

a gas supply configured to supply a processing gas into the chamber, the processing gas including an oxygen-containing gas;

a plasma generator configured to generate a plasma from the processing gas in the chamber; and a controller, wherein the controller is configured to control the gas supply and the plasma generator to remove the metal-containing layer by the plasma. [E19] A substrate processing method including:

(a) providing a substrate including a silicon-containing region with a recess and a metal-containing layer formed on the silicon-containing region; and (b) removing the metal-containing layer by a base, wherein pH of the base is equal to or less than 11.

According to the method [E19], the metal-containing layer may be removed by the reaction between the metal-containing layer and the base.

According to an embodiment, a substrate processing method and a plasma processing apparatus are provided, which are capable of removing a metal-containing layer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:

(a) providing a substrate including a first region containing a first material including silicon and a second region containing a second material different from the first material;

(b) etching the second region while forming a metal-containing layer on the first region, by a plasma generated from a processing gas including halogen and metal;

(c) removing the metal-containing layer with a base.

2. The substrate processing method according to claim 1, further comprising:

(d) between (b) and (c), exposing the substrate to an atmosphere.

3. The substrate processing method according to claim 1, further comprising:

(e) between (b) and (c), exposing the substrate to a plasma generated from an inert gas.

4. The substrate processing method according to claim 1, wherein (c) is performed in a different chamber from the chamber in which (b) is performed.

5. The substrate processing method according to claim 1, wherein the processing gas further includes carbon.

6. The substrate processing method according to claim 1, wherein pH of the base is equal to or less than 11.

7. The substrate processing method according to claim 1, wherein the metal is at least one member selected from the group consisting of molybdenum, tungsten, titanium, niobium, rhenium, osmium, ruthenium, platinum, germanium, and tantalum.

8. The substrate processing method according to claim 1, wherein the processing gas includes metal halide gas.

9. A substrate processing method comprising:

(a) providing a substrate including a silicon-containing region with a recess and a metal-containing layer formed on the silicon-containing region, the metal-containing layer including halogen; and (b) removing the metal-containing layer by a plasma generated from a processing gas including an oxygen-containing gas.

10. The substrate processing method according to claim 9, wherein in (a), a region inside the recess is etched by a plasma generated from a processing gas including halogen and metal.

11. The substrate processing method according to claim 9, wherein the substrate further includes a carbon-containing layer formed on the metal-containing layer.

12. The substrate processing method according to claim 9, wherein the processing gas in (b) further includes an inert gas.

13. The substrate processing method according to claim 9, further comprising:

(c) between (a) and (b), exposing the substrate to a plasma generated from a hydrogen-containing gas; and (d) after (b), exposing the substrate to a base.

14. The substrate processing method according to claim 9, wherein the metal containing layer includes at least one member selected from the group consisting of molybdenum, tungsten, titanium, niobium, rhenium, osmium, ruthenium, platinum, germanium, and tantalum.

15. The substrate processing method according to claim 10, wherein the processing gas includes metal halide gas.

16. The substrate processing method according to claim 9, wherein the oxygen containing gas is at least one of oxygen gas, carbon monoxide gas, carbon dioxide gas, and carbonyl sulfide gas.

17. The substrate processing method according to claim 9, wherein (b) includes (b 1) setting a power level of a radio-frequency power for generating the plasma to a first level, and a level of an electrical bias supplied to a substrate support that supports the substrate to a second level, (b2) after (b 1), setting the power level of the radio-frequency power to a third level lower than the first level, and the level of the electrical bias to the second level, and (b3) after (b2), setting the power level of the radio-frequency power to a fourth level lower than the third level, and the level of the electrical bias to a fifth level higher than the second level.

* * * * *